(12) United States Patent
Lin et al.

(10) Patent No.: US 11,456,243 B2
(45) Date of Patent: Sep. 27, 2022

(54) SEMICONDUCTOR PACKAGE STRUCTURE AND MANUFACTURING METHOD THEREOF

(71) Applicant: Powertech Technology Inc., Hsinchu County (TW)

(72) Inventors: Nan-Chun Lin, Hsinchu County (TW); Hung-Hsin Hsu, Hsinchu County (TW); Shang-Yu Chang Chien, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 17/080,859

(22) Filed: Oct. 27, 2020

(65) Prior Publication Data
US 2021/0202368 A1 Jul. 1, 2021

Related U.S. Application Data

(60) Provisional application No. 62/955,456, filed on Dec. 31, 2019.

(51) Int. Cl.
*H01L 23/498* (2006.01)
*H01L 23/00* (2006.01)
(Continued)

(52) U.S. Cl.
CPC ...... *H01L 23/49838* (2013.01); *H01L 21/481* (2013.01); *H01L 21/4853* (2013.01);
(Continued)

(58) Field of Classification Search
None
See application file for complete search history.

(56) References Cited

U.S. PATENT DOCUMENTS

| 9,666,559 | B2 | 5/2017 | Wang et al. |
| 9,881,850 | B2 * | 1/2018 | Yu .......................... H01L 24/97 |
| 2018/0240744 | A1 | 8/2018 | Kelly et al. |

FOREIGN PATENT DOCUMENTS

| TW | 201234941 | 8/2012 |
| TW | 201628138 | 8/2016 |

(Continued)

OTHER PUBLICATIONS

"Office Action of Taiwan Counterpart Application", dated Nov. 30, 2020, p. 1-p. 6.

*Primary Examiner* — Long Pham
(74) *Attorney, Agent, or Firm* — JCIPRNET

(57) ABSTRACT

A semiconductor package structure, including a circuit substrate, at least two chips, an encapsulant, and a redistribution layer, is provided. The circuit substrate has a first surface and a second surface opposite to the first surface. The at least two chips are disposed on the first surface. Each of the at least two chips has an active surface facing the circuit substrate and includes multiple first conductive connectors and multiple second conductive connectors disposed on the active surface. A pitch of the first conductive connectors is less than a pitch of the second conductive connectors. The encapsulant encapsulates the at least two chips. The redistribution layer is located on the second surface. The first conductive connectors are electrically connected to the redistribution layer by the circuit substrate. The second conductive connectors are electrically connected to the circuit substrate. A manufacturing method of a semiconductor package structure is also provided.

19 Claims, 5 Drawing Sheets

(51) Int. Cl.
| | | |
|---|---|---|
| *H01L 25/18* | (2006.01) | |
| *H01L 21/56* | (2006.01) | |
| *H01L 21/683* | (2006.01) | |
| *H01L 25/065* | (2006.01) | |
| *H01L 25/16* | (2006.01) | |
| *H01L 25/00* | (2006.01) | |
| *H01L 23/31* | (2006.01) | |
| *H01L 23/538* | (2006.01) | |
| *H01L 21/48* | (2006.01) | |
| *H01L 23/24* | (2006.01) | |
| *H01L 21/78* | (2006.01) | |
| *H01L 23/16* | (2006.01) | |
| *H01L 23/367* | (2006.01) | |
| *H01L 23/552* | (2006.01) | |

(52) U.S. Cl.
CPC .......... *H01L 21/4857* (2013.01); *H01L 21/56* (2013.01); *H01L 21/565* (2013.01); *H01L 21/568* (2013.01); *H01L 21/6835* (2013.01); *H01L 21/78* (2013.01); *H01L 23/16* (2013.01); *H01L 23/24* (2013.01); *H01L 23/31* (2013.01); *H01L 23/3128* (2013.01); *H01L 23/3675* (2013.01); *H01L 23/49811* (2013.01); *H01L 23/49816* (2013.01); *H01L 23/49822* (2013.01); *H01L 23/49833* (2013.01); *H01L 23/5385* (2013.01); *H01L 23/5386* (2013.01); *H01L 23/562* (2013.01); *H01L 24/05* (2013.01); *H01L 24/13* (2013.01); *H01L 24/14* (2013.01); *H01L 24/16* (2013.01); *H01L 24/17* (2013.01); *H01L 25/0652* (2013.01); *H01L 25/0655* (2013.01); *H01L 25/16* (2013.01); *H01L 25/18* (2013.01); *H01L 25/50* (2013.01); *H01L 21/561* (2013.01); *H01L 23/552* (2013.01); *H01L 2221/68359* (2013.01); *H01L 2224/02311* (2013.01); *H01L 2224/02313* (2013.01); *H01L 2224/02379* (2013.01); *H01L 2224/02381* (2013.01); *H01L 2224/13024* (2013.01); *H01L 2224/16145* (2013.01); *H01L 2224/16227* (2013.01); *H01L 2224/1716* (2013.01)

(56) References Cited

FOREIGN PATENT DOCUMENTS

| TW | 201810576 | 3/2018 |
|----|-----------|--------|
| TW | 201916277 | 4/2019 |

\* cited by examiner

SEMICONDUCTOR PACKAGE STRUCTURE AND MANUFACTURING METHOD THEREOF

CROSS-REFERENCE TO RELATED APPLICATION

This application claims the priority benefit of U.S. provisional application Ser. No. 62/955,456, filed on Dec. 31, 2019. The entirety of the above-mentioned patent application is hereby incorporated by reference herein and made a part of this specification.

BACKGROUND

Technical Field

This disclosure relates to a package structure and a manufacturing method thereof, and in particular to a semiconductor package structure and a manufacturing method thereof.

Description of Related Art

In order to make the design of electronic products light, thin, short, and small, the semiconductor packaging technology is advancing continuously, in an attempt to develop products with smaller volume, lighter weight, higher integration, and higher market competitiveness. How to reduce the manufacturing cost of the semiconductor package structure while increasing the reliability of the semiconductor package structure is a big challenge for persons skilled in the art.

SUMMARY

This disclosure provides a semiconductor package structure and a manufacturing method thereof, which can reduce the manufacturing cost of the semiconductor package structure while increasing the reliability of the semiconductor package structure.

The disclosure provides a semiconductor package structure, which includes a circuit substrate, at least two chips, an encapsulant, and a redistribution layer. The circuit substrate has a first surface and a second surface opposite to the first surface. The at least two chips are disposed on the first surface. Each of the at least two chips has an active surface facing the circuit substrate and includes multiple first conductive connectors and multiple second conductive connectors disposed on the active surface. A pitch of the multiple first conductive connectors is less than a pitch of the multiple second conductive connectors. The encapsulant encapsulates the at least two chips. The redistribution layer is located on the second surface. The multiple first conductive connectors are electrically connected to the redistribution layer by the circuit substrate. The multiple second conductive connectors are electrically connected to the circuit substrate.

The disclosure provides a manufacturing method of the semiconductor package structure, which at least includes the following steps. A circuit substrate is provided. The circuit substrate has a first surface and a second surface opposite to the first surface. At least two chips are disposed on the first surface. Each of the at least two chips has an active surface facing the circuit substrate and includes multiple first conductive connectors and multiple second conductive connectors disposed on the active surface. A pitch between two adjacent first conductive connectors is less than a pitch between two adjacent second conductive connectors. An encapsulant is formed to encapsulate the at least two chips. A redistribution layer is formed on the second surface of the circuit substrate. The multiple first conductive connectors are electrically connected to the redistribution layer by the circuit substrate. The multiple second conductive connectors are electrically connected to the circuit substrate.

Based on the above, since the pitch of the multiple first conductive connectors is less than the pitch of the multiple second conductive connectors, the first conductive connectors are electrically connected to the redistribution layer by the circuit substrate, and the second conductive connectors are electrically connected to the circuit substrate, the first conductive connectors and the second conductive connectors having different pitches in the semiconductor package structure of the disclosure can effectively use the circuit substrate to achieve different electrical connection requirements between the at least two chips, thereby reducing the number of layers required to form the redistribution layer, so as to reduce the manufacturing cost of the semiconductor package structure. In addition, the above configuration manner can also reduce the manufacturing cost of the semiconductor package structure while increasing the reliability (such as improving the signal integrity/power integrity) of the semiconductor package structure.

To make the above features and advantages more comprehensible, several embodiments accompanied by drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the descriptions, serve to explain the principles of the disclosure.

DESCRIPTION OF THE EMBODIMENTS

Figure 1A:
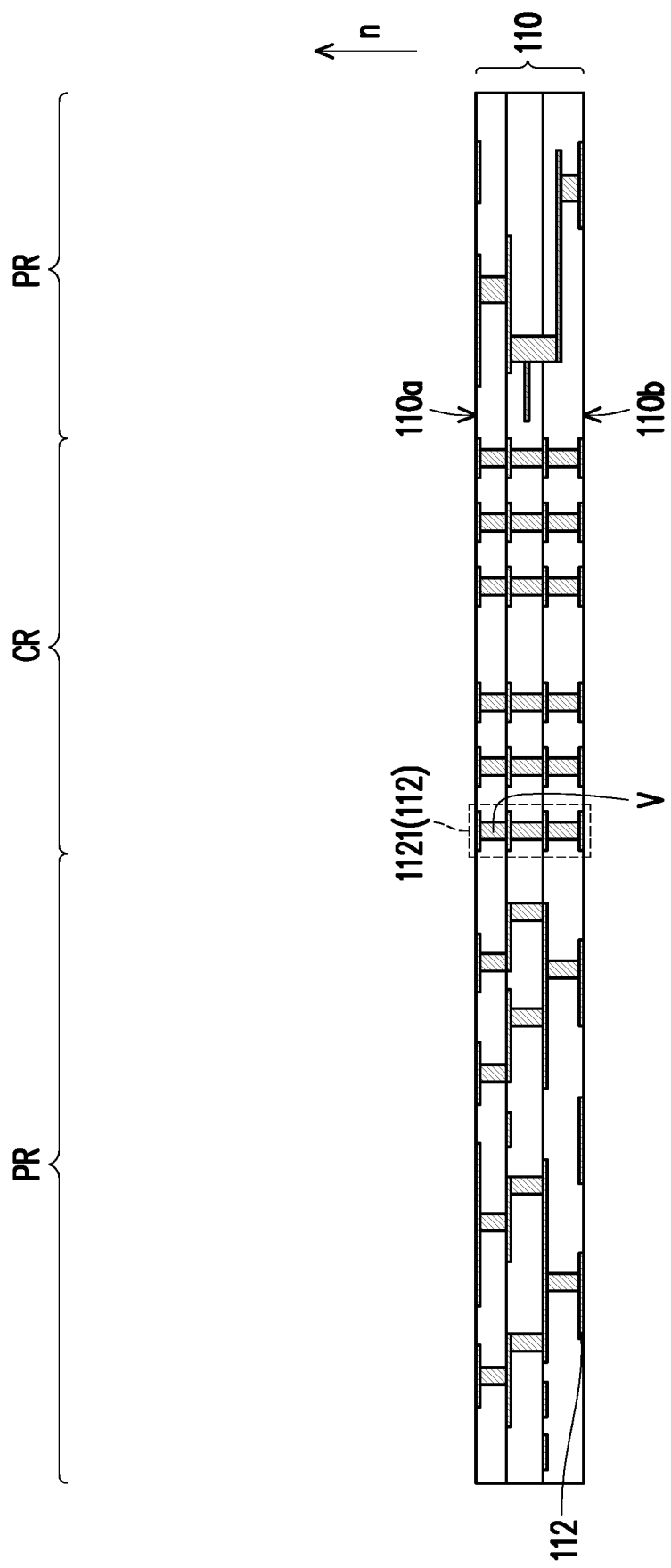
FIGS. 1A to 1E are partial cross-sectional schematic diagrams of a part of a manufacturing method of a semiconductor package structure according to an embodiment of the disclosure.

The directional terminology used in the text (for example, up, down, right, left, front, back, top, bottom) are only used with reference to the drawings and are not intended to imply absolute orientation.

Unless explicitly stated otherwise, any method described in the text is in no way intended to be interpreted as requiring its steps to be performed in a specific order.

The disclosure is described more comprehensively with reference to the drawings of the embodiment. However, the disclosure may also be embodied in various different forms and are not be limited to the exemplary embodiment described in the text. The thickness, dimensions, or size of the layers or regions in the drawings are exaggerated for clarity. The same or similar reference numerals indicate the same or similar elements, which will not be reiterated one by one in the following paragraphs.

FIGS. 1A to 1E are partial cross-sectional schematic diagrams of a part of a manufacturing method of a semiconductor package structure according to an embodiment of the disclosure.

With reference to FIG. 1A, in the embodiment, a manufacturing process of a semiconductor package structure 100 may include the following steps. First, a circuit substrate 110 is provided. The circuit substrate 110 has a first surface 110a and a second surface 110b opposite to the first surface 110a. The circuit substrate 110 may include a conductive circuit 112.

In some embodiments, the circuit substrate 110 may be a printed circuit board (PCB), an organic substrate, or a high density interconnect (HDI) substrate. However, the disclosure does not limit the type of the circuit substrate 110. As long as the circuit substrate 110 has a suitable conductive circuit 112 therein that may provide electrical connections required in subsequent manufacturing processes, the circuit substrate 110 belongs to the protection scope of the disclosure.

With reference to FIG. 1A again, the circuit substrate 110 may include a center region CR and peripheral regions PR. In the embodiment, the conductive circuits 112 may include multiple stacking via structures 1121 located in the center region CR. The stacking via structure 1121 may be connected to the first surface 110a and the second surface 110b of the circuit substrate 110.

In an embodiment, the stacking via structure 1121 may include multiple vias V. The vias V may be mutually stacked in a normal vector n of the first surface 110a. In an embodiment, the orthographic projections of the vias V on the first surface 110a may completely overlap each other. Therefore, the stacking via structure 1121 may serve as a vertical electrical connection structure that provides a shorter electrical connection path in the circuit substrate 110.

Figure 1B:
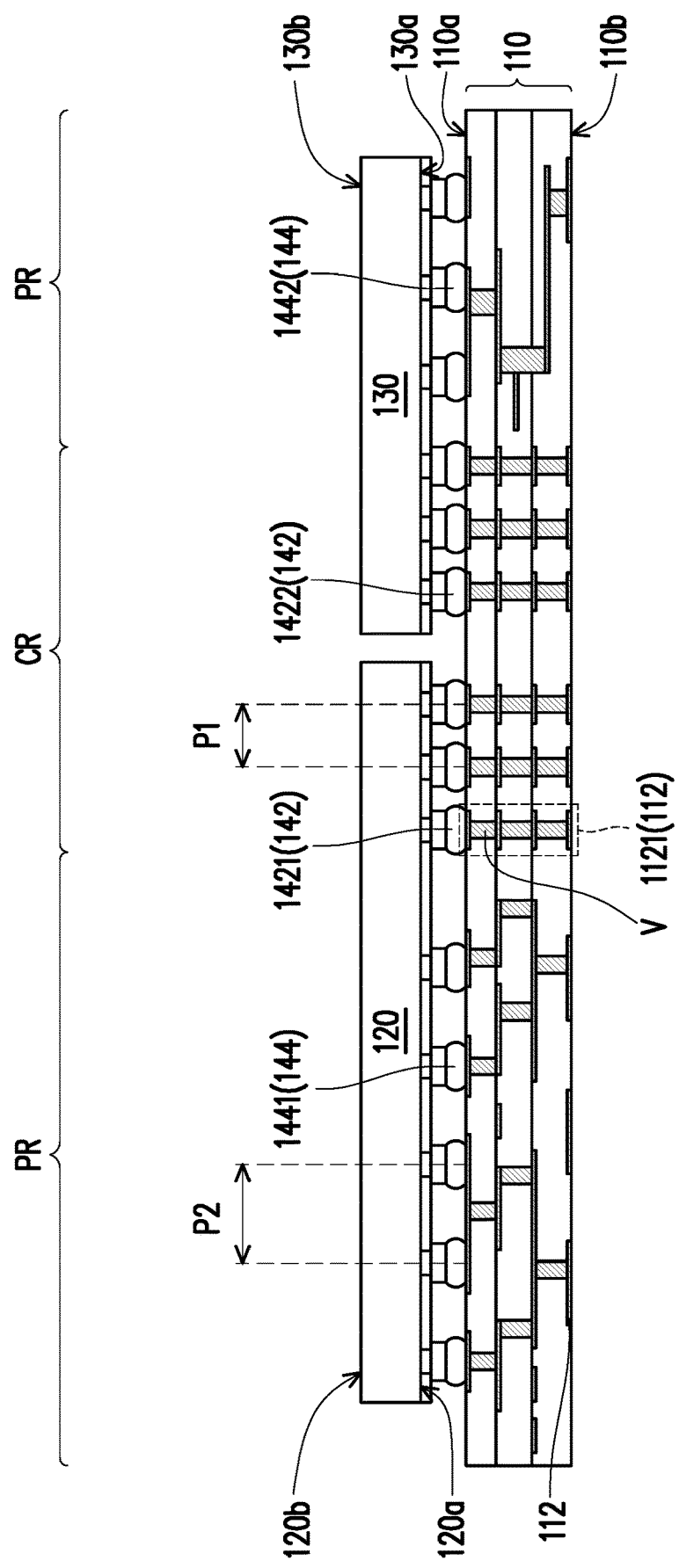

With reference to FIG. 1B, at least two chips are disposed on the first surface 110a of the circuit substrate 110. The at least two chips may include a first chip 120 and a second chip 130. In an embodiment, the first chip 120 and the second chip 130 may have different functions. For example, the first chip 120 may be a system on chip (SoC) and the second chip 130 may be a dynamic random access memory (DRAM), but the disclosure is not limited thereto. The first chip 120 and the second chip 120 may be other suitable semiconductor chips. In an embodiment, the dimensions of the first chip 120 and the second chip 130 may be different.

In the embodiment, each of the at least two chips has an active surface and a back surface opposite to the active surface. The active surface faces the first surface 110a of the circuit substrate 110. For example, the first chip 120 has an active surface 120a and a back surface 120b opposite to the active surface 120a, and the second chip 130 has an active surface 130a and a back surface 130b opposite to the active surface 130a. The first chip 120 and the second chip 130 are, for example, disposed on the first surface 110a of the circuit substrate 110 in a flip-chip manner.

Each of the at least two chips may include multiple first conductive connectors 142 and multiple second conductive connectors 144 disposed on the active surface of each of the at least two chips. The multiple first conductive connectors 142 and the multiple second conductive connectors 144 are electrically connected to the circuit substrate 110. For example, multiple first conductive connectors 1421 and multiple second conductive connectors 1441 may be disposed on the active surface 120a of the first chip 120, and multiple first conductive connectors 1422 and multiple second conductive connectors 1442 may be disposed on the active surface 130a of the second chip 130.

In the embodiment, a pitch P1 between two adjacent first conductive connectors 142 is less than a pitch P2 between two adjacent second conductive connectors 144. Here, the pitch P1 is a distance between the center points of two adjacent first conductive connectors 142 and the pitch P2 is a distance between the center points of two adjacent second conductive connectors 144. The pitch P1 of the multiple first conductive connectors 142 may be known as a fine pitch, and the pitch P2 of the multiple second conductive connectors 144 may be known as a coarse pitch.

Since the pitch P1 between two adjacent first conductive connectors 142 is less than the pitch P2 between two adjacent second conductive connectors 144, the multiple first conductive connectors 142 having the fine pitch may serve as signal input/output contact points, and the multiple second conductive connectors 144 having the coarse pitch may serve as power supply/ground contact points.

With reference to FIG. 1B again, in the embodiment, the center region CR may be a region where one of the at least two chips is close to the other chip, and a peripheral region PR may be a region where one of the at least two chips is far away from the other chip, as shown in FIG. 1B. The multiple first conductive connectors 142 are located in the center region CR, and the multiple second conductive connectors 144 are located in the peripheral regions PR. The multiple first conductive connectors 142 in any one of the at least two chips may be closer to the other one of the at least two chips than the multiple second conductive connectors 144. For example, the multiple first conductive connectors 1421 in the first chip 120 are closer to the second chip 130 than the multiple second conductive connectors 1441, and the multiple first conductive connectors 1422 in the second chip 130 are closer to the first chip 120 than the multiple second conductive connectors 1442.

The first conductive connectors 142 may be electrically connected to the stacking via structures 1121, and the second conductive connectors 144 may be electrically connected to the conductive circuit 112 excluding the multiple stacking via structures 1121 in the circuit substrate 110. In an embodiment, each first conductive connector 142 may be electrically connected to the corresponding stacking via structure 1121. For example, the first conductive connectors 142 and the stacking via structures 1121 may be disposed in a one-to-one manner, but the disclosure is not limited thereto. In an embodiment, the first conductive connectors 142 may be in direct contact with the corresponding stacking via structures 1121.

In the embodiment, the first conductive connector 142 and the second conductive connector 144 are, for example, constituted of pads and conductive bumps, but the disclosure is not limited thereto, and may be determined according to actual requirements.

Figure 1C:
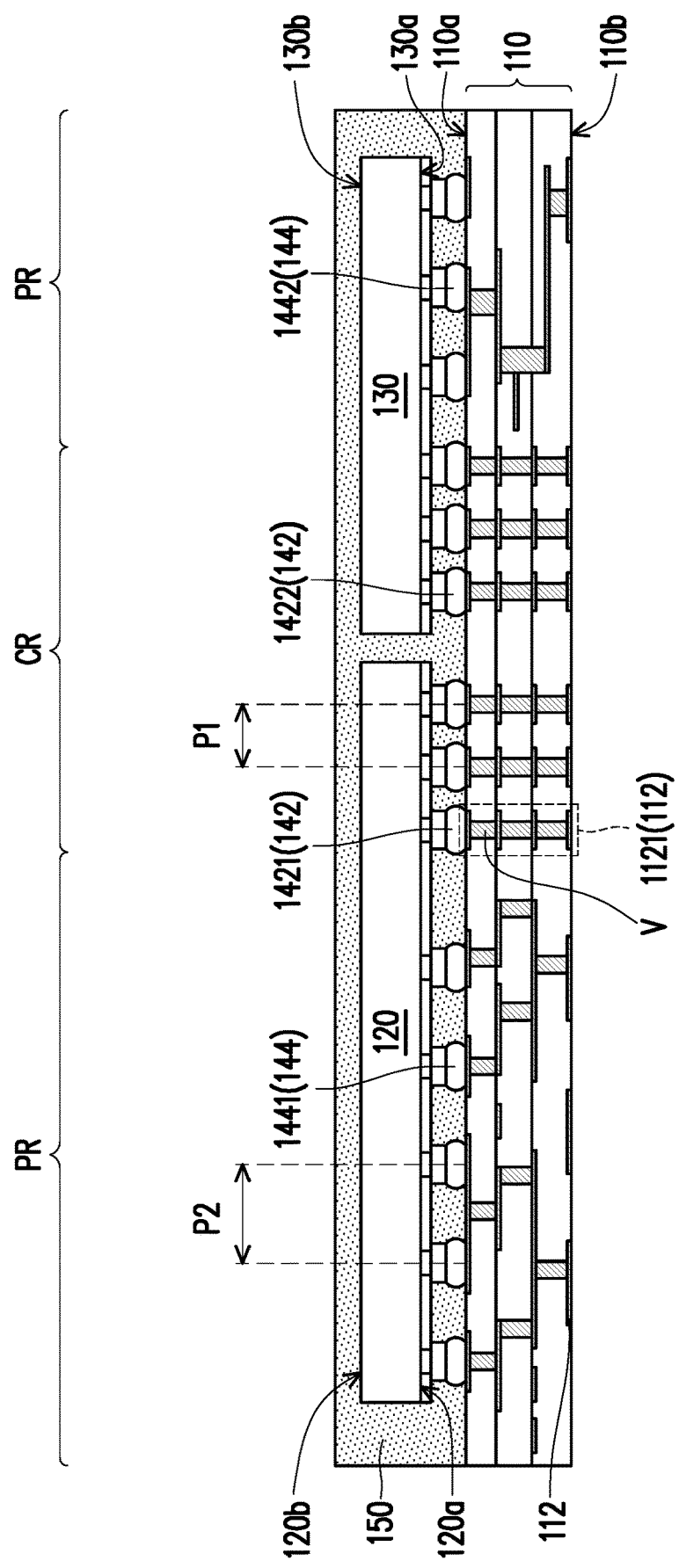

With reference to FIG. 1C, after the at least two chips are disposed on the circuit substrate 110, an encapsulant 150 is formed on the first surface 110a of the circuit substrate 110 to encapsulate the at least two chips. In the embodiment, the encapsulant 150 may completely cover the at least two chips. For example, the encapsulant 150 may cover the back surface 120b of the first chip 120 and the back surface 130b of the second chip 130. The encapsulant 150 may be a molding compound formed by a molding process. In an embodiment, the encapsulant 150 may be formed from insulating materials such as epoxy resin or other suitable resins, but the disclosure is not limited thereto.

In an embodiment that is not shown, the encapsulant 150 may be further subjected to a grinding process until the back surface 120b of the first chip 120 and the back surface 130b of the second chip 130 are exposed, so that the back surface 120b of the first chip 120 is basically coplanar with the back surface 130b of the second chip 130.

Figure 1D:
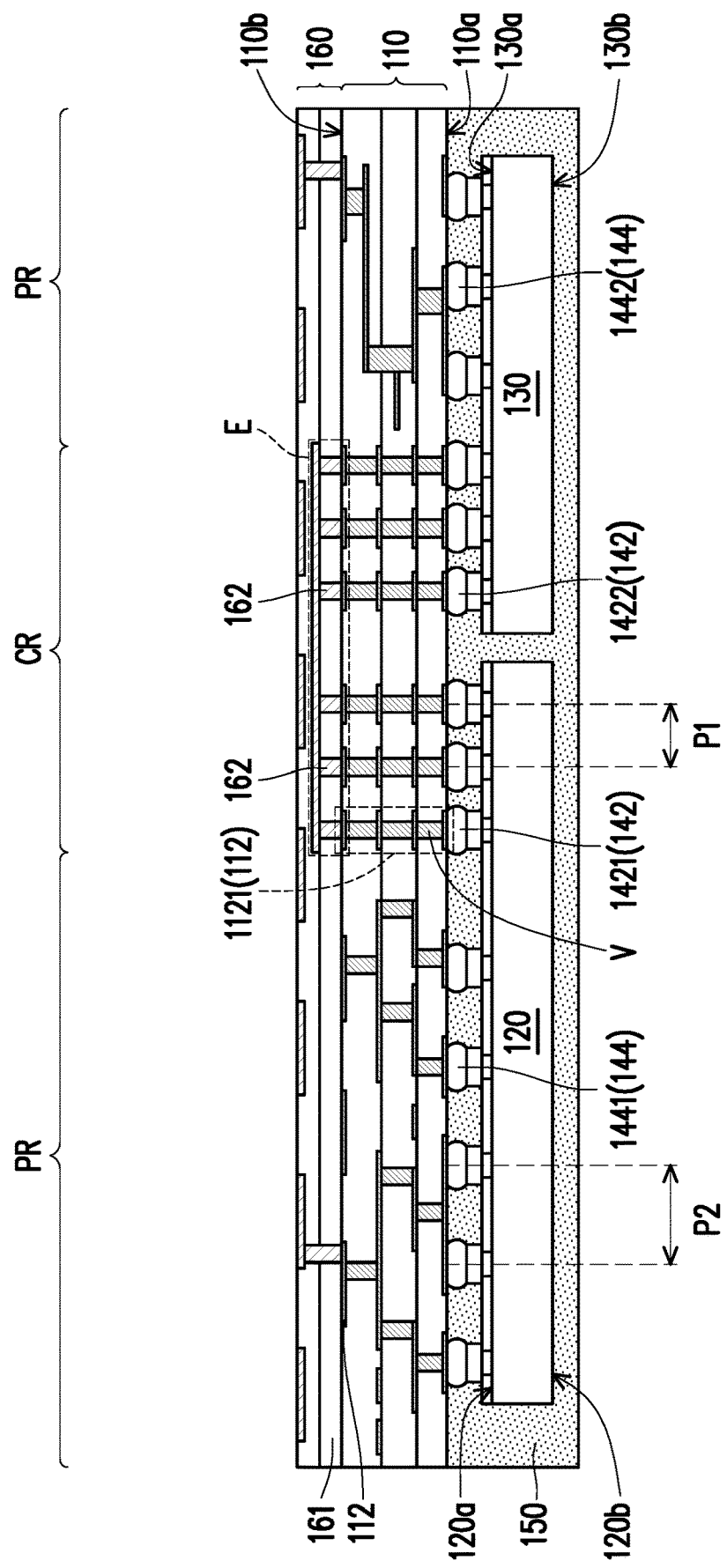

With reference to FIG. 1D, after the encapsulant 150 is formed, the structure shown in FIG. 1C is flipped upside down. Next, a redistribution layer 160 is formed on the second surface 110b of the circuit substrate 110, and the first conductive connectors 142 are electrically connected to the redistribution layer 160 by the circuit substrate 110.

Since the pitch P1 of the multiple first conductive connectors 142 is less than the pitch P2 of the multiple second conductive connectors 144, the first conductive connectors 142 are electrically connected to the redistribution layer 160 by the circuit substrate 110, and the second conductive connectors 144 are electrically connected to the circuit substrate 110, the first conductive connectors 142 and the second conductive connectors 144 having different pitches in the semiconductor package structure 100 of the disclosure can effectively use the circuit substrate 110 to achieve different electrical connection requirements (signal input/output and power supply/ground) between the at least two chips. For example, the multiple first conductive connectors 142 having the fine pitch are electrically connected to the redistribution layer 160 by the circuit substrate 110 to transmit signals, and the multiple second conductive connectors 144 having the coarse pitch are electrically connected to the circuit substrate 110 to connect to the power supply/ground. In this way, the number of layers required to form the redistribution layer 160 may be reduced, thereby reducing the manufacturing cost of the semiconductor package structure 100. In addition, the above configuration manner may further increase the reliability of the semiconductor package structure 100. For example, the semiconductor package structure 100 has better signal integrity/power integrity (SI/PI) performance.

In an embodiment, the redistribution layer 160 may include multiple dielectric layers and multiple patterned conductive layers partially embedded in the multiple dielectric layers. The dielectric layers may include a bottom dielectric layer 161 close to the circuit substrate 110, and the patterned conductive layers may include multiple conductive patterns 162 close to the circuit substrate 110.

A method for forming the redistribution layer 160 is, for example, forming the bottom dielectric layer 161 having multiple openings on the second surface 110b of the circuit substrate 110. The multiple openings expose a part of the conductive circuits 112 in the circuit substrate 110. Next, the conductive patterns 162 are formed in the multiple openings, so that the conductive patterns 162 are electrically connected to the foregoing conductive circuits 112. Then, the above steps may be repeated multiple times to form the redistribution layer 160 composed of the alternately stacked dielectric layers and patterned conductive layers.

In an embodiment, the multiple conductive patterns 162 may respectively correspond to the multiple stacking via structures 1121. The multiple conductive patterns 162 may form a direct electrical connection region E. The multiple openings, for example, expose the multiple stacking via structures 1121 of a part of the conductive circuits 112 in the circuit substrate 110, so that the first conductive connectors 142 may be electrically connected to the conductive patterns 162 in the redistribution layer 160 by the multiple stacking via structures 1121 in the circuit substrate 110, so as to transmit signals between the first chip 120 and the second chip 130. For example, a signal transmission path between the first chip 120 and the second chip 130 is exemplified by transmitting in sequence through the first conductive connector 1421, the stacking via structure 1121, and the conductive pattern 162 on the first chip 120, and the first conductive connector 1422 on the second chip 130. In an embodiment, each of the multiple openings corresponds to one of the multiple stacking via structures 1121.

Since the multiple stacking via structures 1121 may be vertical electrical connection structures, when the first conductive connectors 1421 and the first conductive connectors 1422 on the first chip 120 and the second chip 130 transmit signals by the multiple stacking via structures 1121 in the circuit substrate 110 and the redistribution layer 160, the transmission path/distance may be significantly shortened, so that the semiconductor package structure 100 can have better signal integrity.

In an embodiment, the line-and-space (L/S) of the redistribution layer 160 may be less than 5 µm/5 µm. In an embodiment, the L/S of the redistribution layer 160 is, for example, less than 2 µm/2 µm. Therefore, the redistribution layer 160 may have better signal transmission capability.

In addition, forming the bottom dielectric layer 161 on the circuit substrate 110 may provide buffer for the circuit substrate 110, thereby further increasing the reliability of the semiconductor package structure 100.

It should be noted that the circuit layout in the drawings are for illustration only. Therefore, in the drawings, the conductive circuits 112 and a part of the unconnected circuits in the redistribution layer 160 may actually be electrically connected through the vias or conductors in other directions depending on circuit design requirements.

Figure 1E:
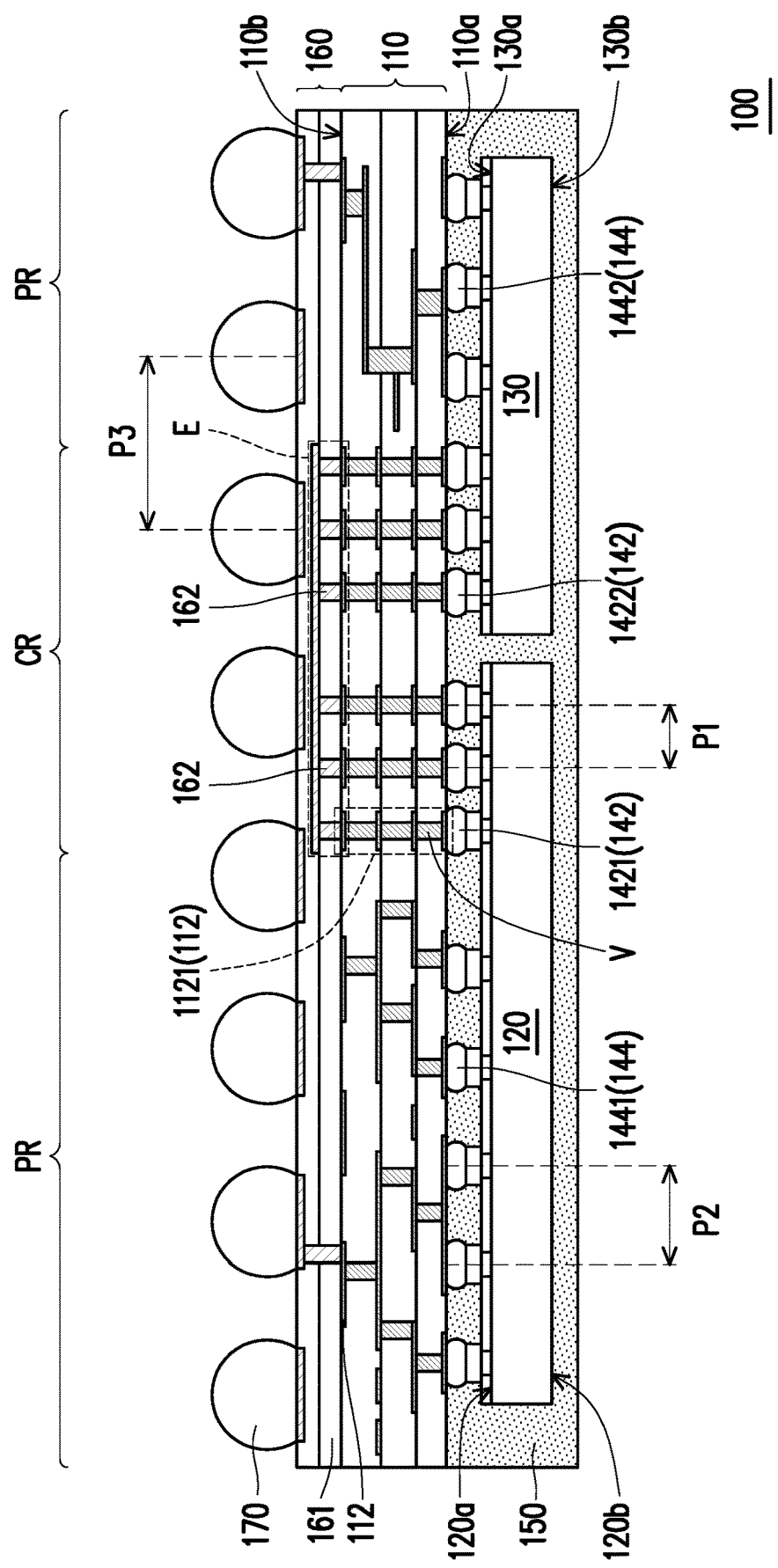

With reference to FIG. 1E, after the redistribution layer 160 is formed, multiple conductive terminals 170 are formed on the redistribution layer 160. The conductive terminals 170 and the redistribution layer 160 are electrically connected. In an embodiment, the redistribution layer 160 is located between the at least two chips and the conductive terminals 170. Therefore, the at least two chips may be electrically connected to the conductive terminals 170 by the circuit substrate 110 and the redistribution layer 160. For example, the multiple second conductive connectors 144 may be electrically connected to the conductive terminals 170 by the circuit substrate 110 and the redistribution layer 160.

In an embodiment, a pitch P3 between two adjacent conductive terminals 170 may be greater than the pitch P1 between two adjacent first conductive connectors 142. Here, the pitch P3 is a distance between the center points of the two adjacent conductive terminals 170.

The conductive terminal 170 may be formed by a ball placement process and/or a reflow process. The conductive terminal 170 may be a conductive bump such as a solder ball. However, the disclosure is not limited thereto. In some alternative embodiments, the conductive terminal 170 may have other possible forms and shapes based on design requirements.

The manufacture of the semiconductor package structure 100 of the embodiment may be substantially completed after the above manufacturing process. The semiconductor package structure 100 includes the circuit substrate 110, the at least two chips (the first chip 120 and the second chip 130), the encapsulant 150, and the redistribution layer 160. The circuit substrate 110 has the first surface 110a and the second surface 110b opposite to the first surface 110a. The at least two chips are disposed on the first surface 110a. Each of the at least two chips has the active surface facing the circuit substrate 110 and includes the multiple first conductive connectors 142 and the multiple second conductive connectors 144 disposed on the active surface. The pitch of the multiple first conductive connectors 142 is less than the pitch of the multiple second conductive connectors 144. The encapsulant 150 encapsulates the at least two chips. The redistribution layer 160 is located on the second surface 110b. The multiple first conductive connectors 142 are electrically connected to the redistribution layer 160 by the circuit substrate 110. The multiple second conductive connectors 144 are electrically connected to the circuit substrate 110.

In summary, since the pitch of the first conductive connectors is less than the pitch of the second conductive connectors, the first conductive connectors are electrically connected to the redistribution layer by the circuit substrate, and the second conductive connectors are electrically connected to the circuit substrate, the first conductive connectors and the second conductive connectors having different pitches in the semiconductor package structure of the disclosure can effectively use the circuit substrate to achieve different electrical connection requirements between the at least two chips, thereby reducing the number of layers required to form the redistribution layer, so as to reduce the manufacturing cost of the semiconductor package structure. In addition, the above configuration manner can also reduce the manufacturing cost of the semiconductor package structure while increasing the reliability (such as improving the signal integrity/power integrity) of the semiconductor package structure. Furthermore, when the first conductive connectors on the first chip and the second chip transmit signals by the multiple stacking via structures in the circuit substrate and the redistribution layer, the transmission path/distance may be significantly shortened, so that the semiconductor package structure can have better signal integrity. In addition, since the circuit substrate in the semiconductor package structure of the disclosure is not a temporary substrate, the cost of using a temporary carrier board during the manufacturing process of the semiconductor package structure may be saved, and there is no need for an additional process to remove the temporary carrier board, thereby further reducing the manufacturing cost of the semiconductor package structure.

Although the disclosure has been described with reference to the abovementioned embodiments, but it is not intended to limit the disclosure. It is apparent that any one of ordinary skill in the art may make changes and modifications to the described embodiments without departing from the spirit and the scope of the disclosure. Accordingly, the scope of the disclosure is defined by the claims appended hereto and their equivalents in which all terms are meant in their broadest reasonable sense unless otherwise indicated.

What is claimed is:

1. A semiconductor package structure, comprising:
    a circuit substrate, having a first surface and a second surface opposite to the first surface, wherein the circuit substrate comprises a center region and a peripheral region;
    at least two chips, disposed on the first surface, wherein each of the at least two chips has an active surface facing the circuit substrate and comprises:
        a plurality of first conductive connectors and a plurality of second conductive connectors, disposed on the active surface, wherein the plurality of first conductive connectors are located in the center region, and the plurality of second conductive connectors are located in the peripheral region; and
        a pitch of the plurality of first conductive connectors is less than a pitch of the plurality of second conductive connectors;
    an encapsulant, encapsulating the at least two chips; and
    a redistribution layer, located on the second surface, wherein the plurality of first conductive connectors are electrically connected to the redistribution layer by the circuit substrate, and the plurality of second conductive connectors are electrically connected to the circuit substrate.

2. The semiconductor package structure according to claim 1, wherein the plurality of first conductive connectors of any one of the at least two chips are closer to the other of the at least two chips than the plurality of second conductive connectors.

3. The semiconductor package structure according to claim 1, wherein the circuit substrate comprises a plurality of stacking via structures, and the plurality of first conductive connectors are electrically connected to the redistribution layer by the plurality of stacking via structures.

4. The semiconductor package structure according to claim 3, wherein the plurality of stacking via structures are located in the center region.

5. The semiconductor package structure according to claim 3, wherein the plurality of first conductive connectors are in direct contact with the plurality of stacking via structures.

6. The semiconductor package structure according to claim 3, wherein the second conductive connectors are electrically connected to conductive circuits excluding the plurality of stacking via structures in the circuit substrate.

7. The semiconductor package structure according to claim 3, wherein the plurality of stacking via structures comprise a plurality of vias, and the plurality of vias are mutually stacked in a normal vector of the first surface.

8. The semiconductor package structure according to claim 3, wherein orthographic projections of a plurality of vias on the first surface completely overlap each other.

9. The semiconductor package structure according to claim 3, wherein the redistribution layer comprises a plurality of conductive patterns close to the circuit substrate, and the plurality of conductive patterns correspond to the plurality of stacking via structures.

10. The semiconductor package structure according to claim 1, further comprising:
    a plurality of conductive terminals, electrically connected to the redistribution layer, wherein the redistribution layer is located between the circuit substrate and the plurality of conductive terminals.

11. The semiconductor package structure according to claim 10, wherein the plurality of second conductive connectors are electrically connected to the conductive terminals by the circuit substrate and the redistribution layer.

12. The semiconductor package structure according to claim 10, wherein the pitch of the plurality of first conductive connectors is less than a pitch of the plurality of conductive terminals.

13. The semiconductor package structure according to claim 1, wherein dimensions of the at least two chips are different.

14. A manufacturing method of a semiconductor package structure, comprising:
    providing a circuit substrate, having a first surface and a second surface opposite to the first surface, wherein the circuit substrate comprises a center region and a peripheral region;
    disposing at least two chips on the first surface, wherein each of the at least two chips has an active surface facing the circuit substrate and comprises:
        a plurality of first conductive connectors and a plurality of second conductive connectors, disposed on the active surface, wherein the plurality of first conductive connectors are located in the center region, and the plurality of second conductive connectors are located in the peripheral region; and a pitch between two adjacent first conductive connectors is less than a pitch between two adjacent second conductive connectors;

forming an encapsulant to encapsulate the at least two chips; and forming a redistribution layer on the second surface of the circuit substrate, wherein the plurality of first conductive connectors are electrically connected to the redistribution layer by the circuit substrate, and the plurality of second conductive connectors are electrically connected to the circuit substrate.

15. The manufacturing method of the semiconductor package structure according to claim 14, wherein the step of forming the redistribution layer is after the step of disposing the at least two chips.

16. The manufacturing method of the semiconductor package structure according to claim 14, wherein the circuit substrate is not a temporary substrate.

17. The manufacturing method of the semiconductor package structure according to claim 14, wherein the step of forming the redistribution layer comprises:

forming a bottom dielectric layer on the second surface, wherein the bottom dielectric layer has a plurality of openings, exposing a part of conductive circuits in the circuit substrate; and forming conductive patterns in the openings, so that the conductive patterns are electrically connected to the part of the conductive circuits.

18. The manufacturing method of the semiconductor package structure according to claim 14, wherein a part of conductive circuits comprise a plurality of stacking via structures, and the plurality of openings expose the plurality of stacking via structures.

19. The manufacturing method of the semiconductor package structure according to claim 18, wherein each of the plurality of openings corresponds to one of the plurality of stacking via structures.

\* \* \* \* \*